United States Patent
Belotserkovsky et al.

(10) Patent No.: US 7,468,962 B2
(45) Date of Patent: Dec. 23, 2008

(54) METHOD AND APPARATUS FOR ANTENNA SELECTION USING CHANNEL RESPONSE INFORMATION IN A MULTI-CARRIER SYSTEM

(75) Inventors: Maxim Borisovich Belotserkovsky, Indianapolis, IN (US); Vincent Demoulin, Pleumeleuc (FR); Louis Robert Litwin, Plainsboro, NJ (US)

(73) Assignee: Thomson Licensing S.A., Boulogne, Billancourt (FR)

( * ) Notice: Subject to any disclaimer, the term of this patent is extended or adjusted under 35 U.S.C. 154(b) by 775 days.

(21) Appl. No.: 10/518,555

(22) PCT Filed: Jun. 28, 2002

(86) PCT No.: PCT/US02/20504

§ 371 (c)(1),
(2), (4) Date: Dec. 22, 2004

(87) PCT Pub. No.: WO2004/003743

PCT Pub. Date: Aug. 1, 2004

(65) Prior Publication Data

US 2005/0193305 A1 Sep. 1, 2005

(51) Int. Cl.
*H04Q 7/00* (2006.01)
(52) U.S. Cl. .................. 370/329; 370/208; 370/437
(58) Field of Classification Search ........... 370/329, 370/208, 437
See application file for complete search history.

(56) References Cited

U.S. PATENT DOCUMENTS

| | | | |
|---|---|---|---|
| 5,909,436 A | 6/1999 | Engstrom et al. | |
| 6,359,938 B1 | 3/2002 | Keevill et al. | |
| 6,563,885 B1 * | 5/2003 | Magee et al. | 375/316 |
| 6,847,616 B2 * | 1/2005 | Horisaki et al. | 370/252 |
| 6,973,134 B1 * | 12/2005 | Jones, IV et al. | 375/260 |
| 6,985,434 B2 * | 1/2006 | Wu et al. | 370/208 |
| 6,990,153 B1 * | 1/2006 | Farhang-Boroujeni et al. | 375/260 |
| 2002/0073436 A1 | 6/2002 | Cowley et al. | |

(Continued)

FOREIGN PATENT DOCUMENTS

JP 2000188585 4/2000

(Continued)

OTHER PUBLICATIONS

Search Report dated Nov. 3, 2002.

*Primary Examiner*—Huy D. Vu
*Assistant Examiner*—Jason Mattis
(74) *Attorney, Agent, or Firm*—Joseph J. Laks; Vincent E. Duffy; Michael A. Pugel (57) ABSTRACT

The disclosed embodiments relate to a technique for selecting one of several antennas or channels in a receiver based on the quality of the channel response at each of the antennas in a multicarrier system employing convolutional forward error-correction coding. Channel estimates are computed for each subcarrier and monotonic weights are assigned to each subcarrier based on the relative strength of the channel response for that subcarrier. The monotonic weights are mapped to each bit in a symbol for each subcarrier and bits are de-interleaved, if needed. A sliding window evaluation is performed to determine an overall channel quality metric for each channel. The antenna or channel having the highest overall CQM is selected to receive data.

20 Claims, 7 Drawing Sheets

U.S. PATENT DOCUMENTS

| | | | |
|---|---|---|---|
| 2002/0111142 A1* | 8/2002 | Klimovitch | 455/63 |
| 2002/0114270 A1* | 8/2002 | Pierzga et al. | 370/208 |
| 2002/0177447 A1* | 11/2002 | Walton et al. | 455/452 |
| 2003/0128658 A1* | 7/2003 | Walton et al. | 370/208 |

FOREIGN PATENT DOCUMENTS

| | | |
|---|---|---|
| WO | WO00/54445 | 9/2000 |

\* cited by examiner

METHOD AND APPARATUS FOR ANTENNA SELECTION USING CHANNEL RESPONSE INFORMATION IN A MULTI-CARRIER SYSTEM

This application claims the benefit, under 35 U.S.C. § 365 of International Application PCT/US02/20504, filed Jun. 28, 2002, which was published in accordance with PCT Article 21(2) on Jan. 8, 2004 in English and which claims the benefit of PCT International patent application No. PCT/US02/20504, filed Jun. 28, 2002.

FIELD OF THE INVENTION

The present invention relates to improving the reception of transmitted Coded Orthogonal Frequency Division Multiplexed (COFDM) signals in a multi-carrier system.

BACKGROUND OF THE INVENTION

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements is are to be read in this light, and not as admissions of prior art.

A wireless LAN (WLAN) is a flexible data communications system implemented as an extension to, or as an alternative for, a wired LAN within a building or campus. Using electromagnetic waves, WLANs transmit and receive data over the air, minimizing the need for wired connections. Thus, WLANs combine data connectivity with user mobility, and, through simplified configuration, enable movable LANs. Some industries that have benefited from the productivity gains of using portable terminals (e.g., notebook computers) to transmit and receive real-time information are the digital home networking, health-care, retail, manufacturing, and warehousing industries.

Manufacturers of WLANs have a range of transmission technologies to choose from when designing a WLAN. Some exemplary technologies are multicarrier systems, spread spectrum systems, narrowband systems, and infrared systems. Although each system has its own benefits and detriments, one particular type of multicarrier transmission system, orthogonal frequency division multiplexing (OFDM), has proven to be exceptionally useful for WLAN communications.

OFDM is a robust technique for efficiently transmitting data over a channel. The technique uses a plurality of sub-carrier frequencies (sub-carriers) within a channel bandwidth to transmit data. These sub-carriers are arranged for optimal bandwidth efficiency compared to conventional frequency division multiplexing (FDM) which can waste portions of the channel bandwidth in order to separate and isolate the sub-carrier frequency spectra and thereby avoid inter-carrier interference (ICI). By contrast, although the frequency spectra of OFDM sub-carriers overlap significantly within the OFDM channel bandwidth, OFDM nonetheless allows resolution and recovery of the information that has been modulated onto each sub-carrier.

The transmission of data through a channel via OFDM signals also provides several other advantages over more conventional transmission techniques. Some of these advantages are a tolerance to multipath delay spread and frequency selective fading, efficient spectrum usage, simplified sub-channel equalization, and good interference properties.

In an OFDM receiver with multiple receiving antennas or multiple transmission channels available it may be beneficial to be able to select an antenna or channel that provides better reception according to some predetermined criterion. One example of a selection process that may be used is to estimate the bit error rate (BER) of each available antenna or channel and pick the antenna or channel that exhibits the lowest BER estimate. However, a direct BER estimation may require a significant amount of processing time and may not be desirable or feasible in some systems, in particular in bursty transmission systems.

One traditional approach to identifying an antenna or channel that is likely to provide a low BER has been to look at the average signal power of the multiple subcarriers being received. The average signal power does not, however, necessarily translate unequivocally into a corresponding BER because channels having the same average power can have different shape of the channel response. Accordingly, different BERs may be obtained in subsequent stages of the receiver. A method and apparatus for identifying the antenna or channel in an OFDM receiver that is likely to provide a low BER based on antenna or channel response characteristics is desirable.

SUMMARY OF THE INVENTION

The disclosed embodiments relate to a technique for selecting one of several antennas or channels in a receiver based on the quality of the channel response at each of the antennas in a multicarrier system employing convolutional forward error-correction coding. Channel estimates are computed for each subcarrier and monotonic weights are assigned to each subcarrier based on the relative strength of the channel response for that subcarrier. The monotonic weights are mapped to each bit in a symbol for each subcarrier and bits are de-interleaved, if needed. A sliding window evaluation is performed to determine an overall channel quality metric (CQM) for each channel. The antenna or channel having the highest overall CQM is selected to receive data.

DETAILED DESCRIPTION OF THE PREFERRED EMBODIMENT

The characteristics and advantages of the present invention will become more apparent from the following description given by way of example.

Figure 1:
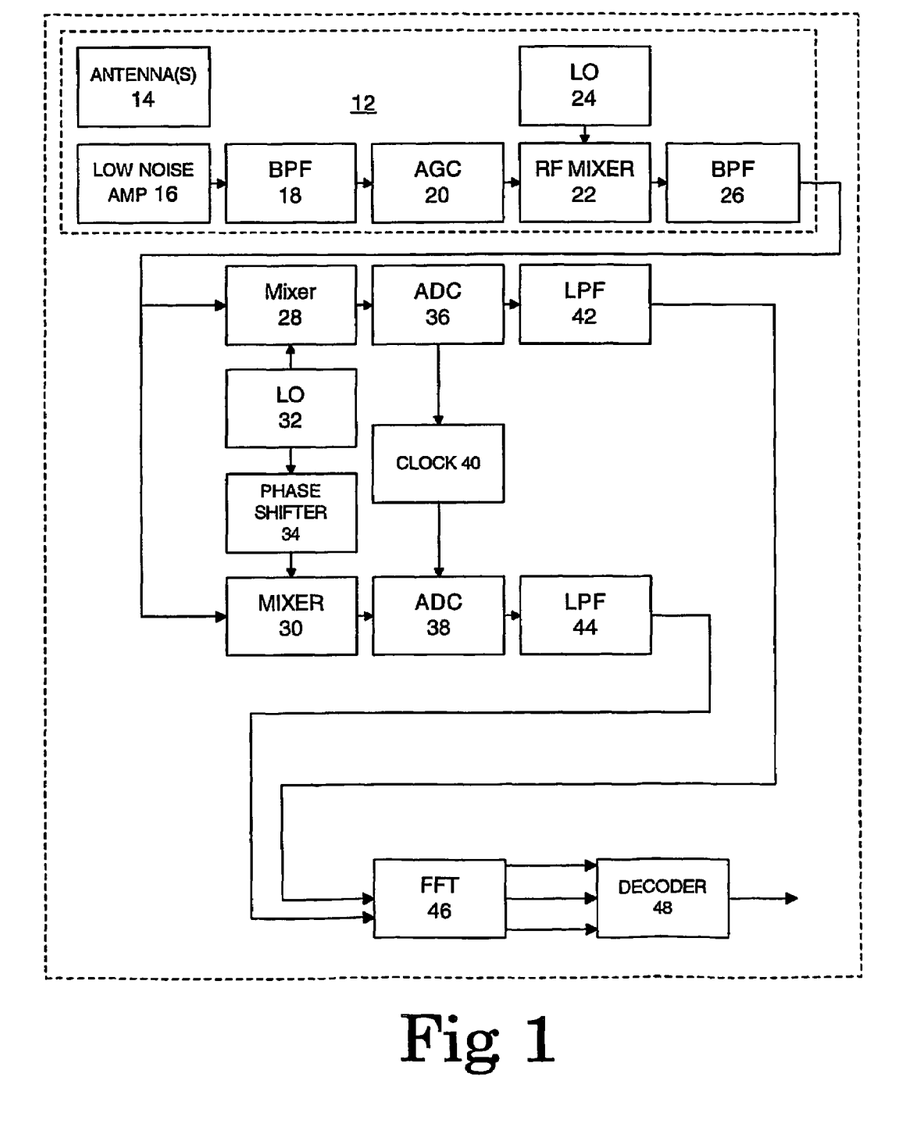
FIG. 1 is a block diagram of an exemplary OFDM receiver.

Referring to FIG. 1, the first element of a typical OFDM receiver 10 15 is an RF receiver 12. Many variations of the RF receiver 12 exist and are well known in the art, but typically, the RF receiver 12 includes one or more antennas 14, a low noise amplifier (LNA) 16, an RF band pass filter 18, an automatic gain control (AGC) circuit 20, an RF mixer 22, an RF carrier frequency local oscillator 24, and an IF band pass filter 26.

Through the antennas 14, the RF receiver 12 couples in the RF OFDM-modulated carrier after it passes through the channel. Then, by mixing it with a receiver carrier of frequency $f_{cr}$ generated by the RF local oscillator 24, the RF receiver 12 downconverts the RF OFDM-modulated carrier to obtain a received IF OFDM signal. The frequency difference between the receiver carrier and the transmitter carrier contributes to the carrier frequency offset, delta $f_c$.

This received IF OFDM signal is coupled to a mixer 28 and a mixer 30 to be mixed with an in-phase IF signal and a 90° phase-shifted (quadrature) IF signal, respectively, to produce in-phase and quadrature OFDM signals, respectively. The in-phase IF signal that feeds into the mixer 28 is produced by an IF local oscillator 32. The 90° phase-shifted IF signal that feeds into mixer 30 is derived from the in-phase IF signal of the IF local oscillator 32 by passing the in-phase IF signal through a 90° phase shifter 34 before providing it to the mixer 30.

The in-phase and quadrature OFDM signals then pass into analog-to-digital converters (ADCs) 36 and 38, respectively, where they are digitized at a sampling rate $f_{ck\_r}$ as determined by a clock circuit 40. The ADCs 36 and 38 produce digital samples that form an in-phase and a quadrature discrete-time OFDM signal, respectively. The difference between the sampling rates of the receiver and that of the transmitter is the sampling rate offset, delta $f_{ck} = f_{ck\_r} - f_{ck\_t}$.

The unfiltered in-phase and quadrature discrete-time OFDM signals from the ADCs 36 and 38 then pass through digital low-pass filters 42 and 44, respectively. The output of the low pass digital filters 42 and 44 are filtered in-phase and quadrature samples, respectively, of the received OFDM signal. In this way, the received OFDM signal is converted into in-phase ($q_i$) and quadrature ($p_i$) samples that represent the real and imaginary-valued components, respectively, of the complex-valued OFDM signal, $r_i = q_i + jp_i$. These in-phase and quadrature (real-valued and imaginary-valued) samples of the received OFDM signal are then delivered to an FFT 46. Note that in some conventional implementations of the receiver 10, the analog-to-digital conversion is done before the IF mixing process. In such an implementation, the mixing process involves the use of digital mixers and a digital frequency synthesizer. Also note that in many conventional implementations of receiver 10, the digital-to-analog conversion is performed after the filtering.

The FFT 46 performs the Fast Fourier Transform (FFT) of the received OFDM signal in order to recover the sequences of frequency-domain sub-symbols that were used to modulate the sub-carriers during each OFDM symbol interval. The FFT 46 then delivers these sequences of sub-symbols to a decoder 48.

The decoder 48 recovers the transmitted data bits from the sequences of frequency-domain sub-symbols that are delivered to it from the FFT 46. This recovery is performed by decoding the frequency-domain sub-symbols to obtain a stream of data bits which should ideally match the stream of data bits that were fed into the OFDM transmitter. This decoding process can include soft Viterbi decoding and/or Reed-Solomon decoding, for example, to recover the data from the block and/or convolutionally encoded sub-symbols.

Figure 2:
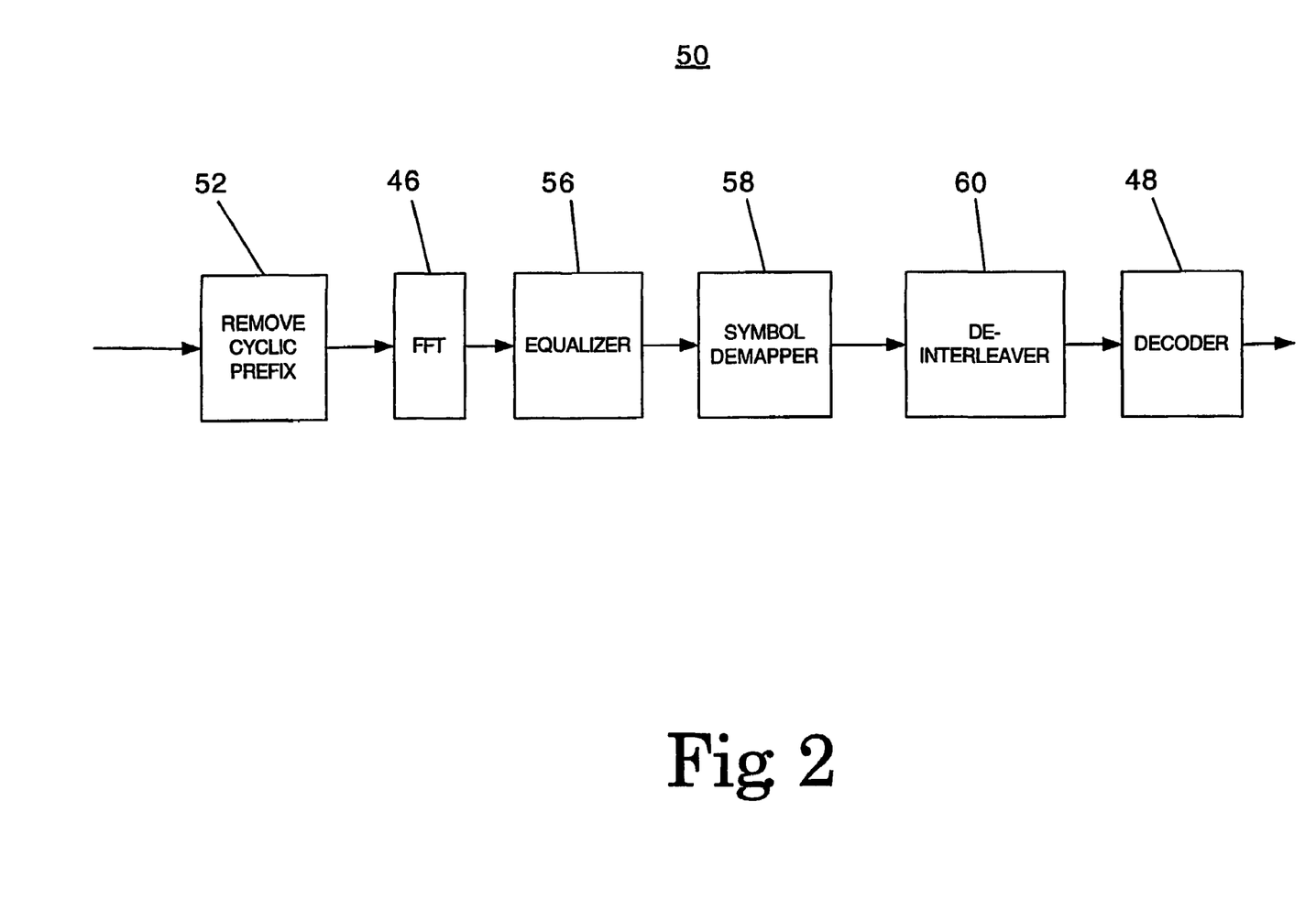
FIG. 2 is a block diagram showing a receiver that is adapted to receive and decode coded OFDM transmissions.

FIG. 2 is a block diagram showing a receiver that is adapted to receive and decode coded OFDM transmissions. Coded OFDM, or COFDM, is a term used for a system in which the error control coding and OFDM modulation processes work closely together. The COFDM receiver illustrated in FIG. 2 is generally referred to by the reference numeral 50. The COFDM receiver 50 includes typical functionality such as cyclic prefix removal circuitry 52, FFT circuitry 46 and equalizing circuitry 56. As discussed below, the COFDM receiver 50 also includes additional circuitry adapted to process received COFDM signals.

In preparing a COFDM signal for transmission, an important step is to interleave and code the bits of source data prior to processing them with an Inverse Fast Fourier Transform (IFFT). Bits may be coded into a constellation of symbols to allow transmission of greater amounts of data per a given unit of bandwidth. One example of a transmission constellation is 64-QAM, which uses quadrature amplitude modulation to transform a data stream into 6-bit symbols. The coded bits may be further subjected to convolutional encoding using a forward error correction algorithm such as a Viterbi algorithm. Such convolutional encoding allows correction of bits that are received incorrectly at the receiver.

As part of the coding process, adjacent bits of source data may be interleaved by taking adjacent bits of the source data and spreading them out across multiple subcarriers. Interleaving prevents loss or impairment of one or more subcarriers because of a frequency null. Such a loss may potentially cause a contiguous stream of bit errors. Such a burst of errors would typically be hard to correct with conventional error correction coding technology.

The COFDM receiver 50 includes functional blocks associated with processing received COFDM signals. Specifically, the COFDM receiver 50 contains functionality adapted to reverse the encoding process that took place prior to transmission of the data so that the source data may be retrieved. The COFDM receiver 50 includes a symbol demapper to interpret the received COFDM symbols. A de-interleaver 60 is adapted to reverse the interleaving process that occurred prior to transmission and return the received bits to their correct order. Finally, a Viterbi decoder 48 is adapted to reconstruct the symbols into a stream of binary data.

The interleaving of bits upon transmission spreads out the contiguous bits such that bit errors become spaced far apart in time. This spacing makes it easier for a decoder such as a Viterbi decoder to correct bit errors. For example, a Viterbi decoder may be able to correct up to four successive incorrectly received bits. If bits from the source data are randomly distributed across subcarriers by interleaving, the chances that more than four bits from a nulled or impaired subcarrier will be received in sequence are reduced.

Figure 3:
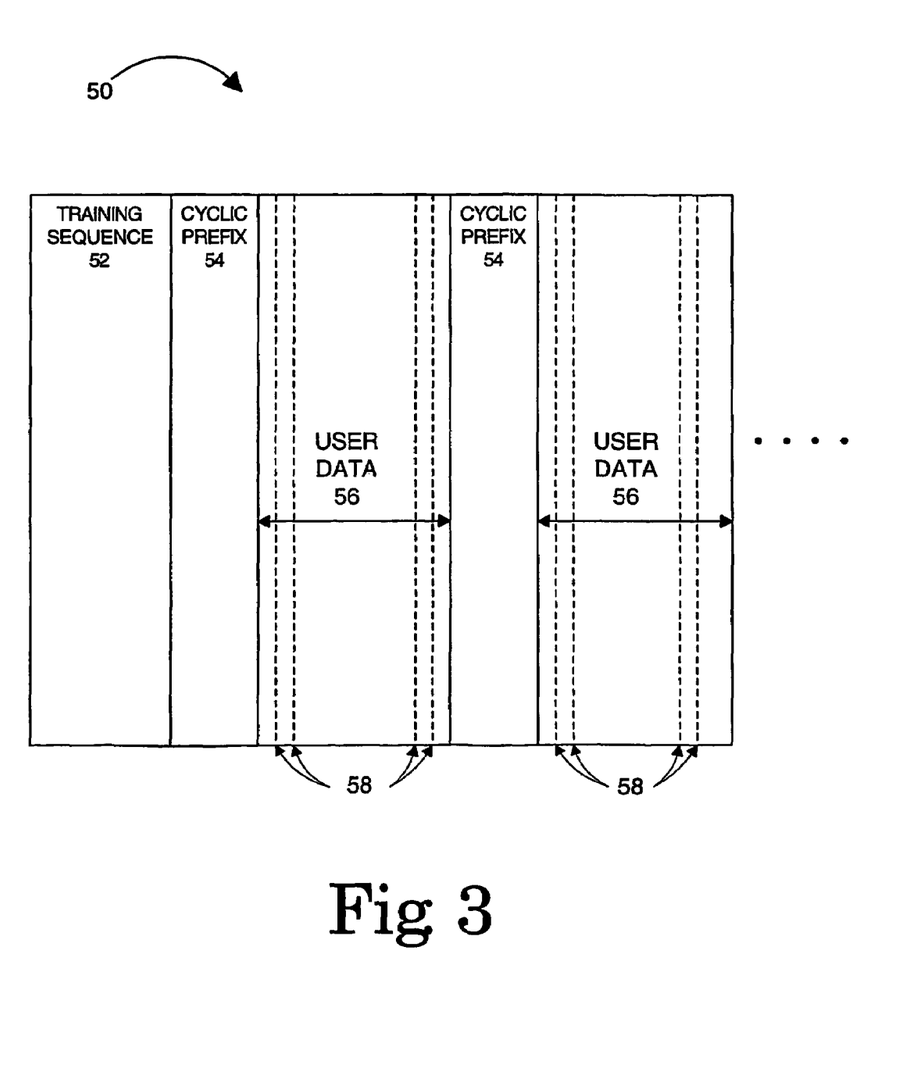
FIG. 3 is a diagram illustrating the placement of a training sequence, user data, and pilot signals within an OFDM symbol frame.

Turning to FIG. 3, an exemplary OFDM symbol frame 50 of the present invention is shown. The symbol frame 50 includes a training sequence or symbol 52 containing known transmission values for each subcarrier in the OFDM symbol, and a predetermined number of a cyclic prefix 54 and user data 56 pairs. For example, the proposed ETSI-BRAN HIPERLAN/2 (Europe) and IEEE 802.11a (USA) wireless LAN standards, herein incorporated by reference, assign 64 known values or subsymbols (i.e., 52 non-zero values and 12 zero values) to selected training symbols of a training sequence (e.g., "training symbol C" of the proposed ETSI standard and "long OFDM training symbol" of the proposed IEEE standard). The user data 56 has a predetermined number of pilots 58, also containing known transmission values, embedded on predetermined subcarriers. For example, the proposed ETSI and IEEE standards have four pilots located at bins or subcarriers ±7 and ±21. Although the present invention is described as operating in a receiver that conforms to the proposed ETSI-BRAN HIPERLAN/2 (Europe) and IEEE 802.11a (USA) wireless LAN standards, it is considered within the skill of one skilled in the art to implement the teachings of the present invention in other OFDM systems.

Figure 4:
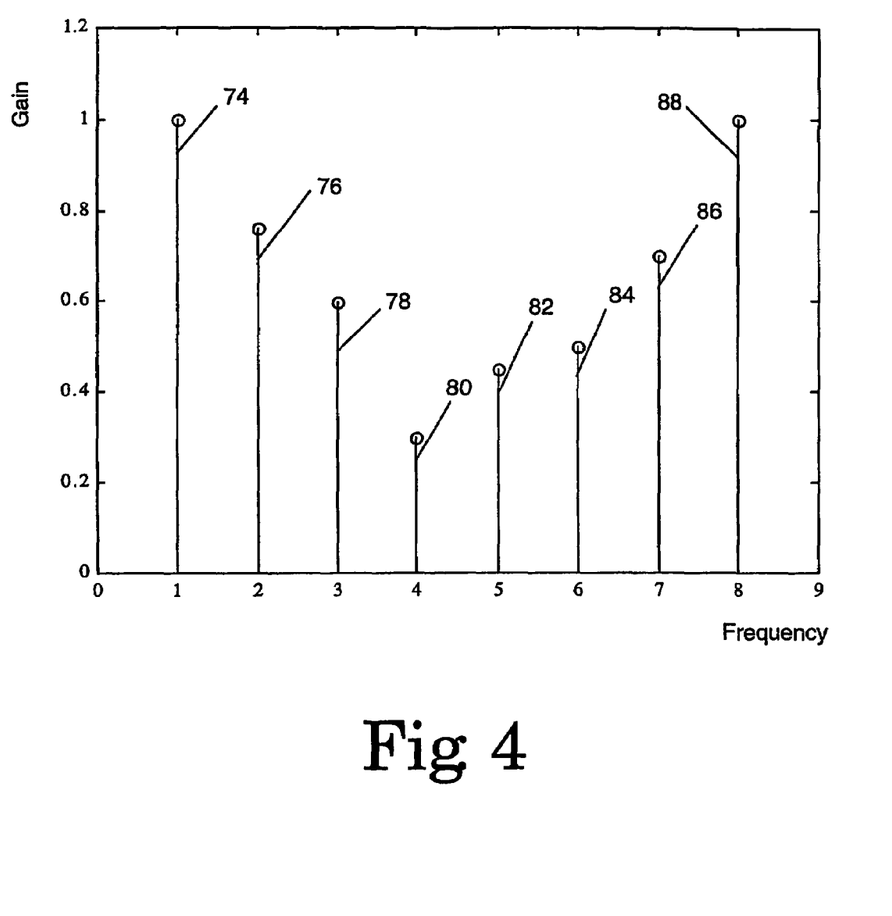
FIG. 4 is a diagram showing the frequency response of an OFDM transmission channel.

FIG. 4 is a diagram showing the frequency response of an OFDM transmission channel. A plurality of subcarriers 74-88 are identified, respectively, by numbers 1-8 on the frequency axis. The gain of each subcarrier is illustrated by the magnitude of the subcarrier on the gain axis. As can be seen in FIG. 4, the subcarrier 80 has the smallest gain of any subcarrier in the channel. Accordingly, information transmitted using subcarrier 80 has the highest likelihood of being received incorrectly. As set forth above, interleaving of bits minimizes the likelihood that a stream of bits greater than the correction strength of the Viterbi decoder 48 (FIG. 2) will be transmitted across the subcarrier 80.

The present invention makes use of the relative gains of each subcarrier within an OFDM channel to determine the reliability of the received bits. The values of the equalizer response for the subcarriers shown in FIG. 4 may be used to infer or estimate the strength of the received subcarriers.

Those of ordinary skill in the field will appreciate that the value of the equalizer response for a given subcarrier varies inversely with the strength of the subcarrier signal. For example, if the equalizer response had a large value at a certain frequency, it would correspond to a frequency null at that point in the channel. The equalizer response would have a large value at that point because it is trying to compensate for the weak received signal. This reliability information is passed on to the Viterbi decoder 48 (FIG. 2) so that it may properly weight the bits when making decoding decisions. In the case of a frequency null (such as the subcarrier 80), the bits would be marked as "low confidence" and those bits would not be weighted as heavily as bits from a strong subcarrier.

To evaluate the relative likelihood that each antenna or channel will produce a more accurate output, each antenna or channel may be assigned an overall channel quality metric (CQM). After computation, the overall CQM for each antenna or channel may be stored for later comparison. The choice of the antenna or channel to be used for the subsequent reception may be based on which antenna or channel exhibits the best overall CQM.

To perform an evaluation of the reception of the channel shown in FIG. 4, the first step is to compute an estimate of the magnitude of the channel response for each of the multiple subcarriers 74-88. This is typically performed using training symbols using any of a number of well-known techniques.

The next step in determining the overall CQM is to assign weights or metrics to each of the sub-carriers where the values of the weights are monotonically related to the strength of the corresponding channel response magnitude at that subcarrier frequency. For example, as the channel response magnitudes of the sub-carriers increase the value of the assigned weights may be non-decreasing. One method of creating monotonic metrics is to assign the metrics based on a logarithmic value that is proportional to the sub-carrier gain. The metrics should reflect the statistical average of the reliability of the data received on a given subcarrier. For example, each subcarrier may be assigned integers one (1) through five (5), with five (5) corresponding to the subcarrier with the highest reliability and one (1) to the subcarrier with the lowest reliability. Generally, a subcarrier is deemed more reliable if its channel response has a higher magnitude.

Figure 5:
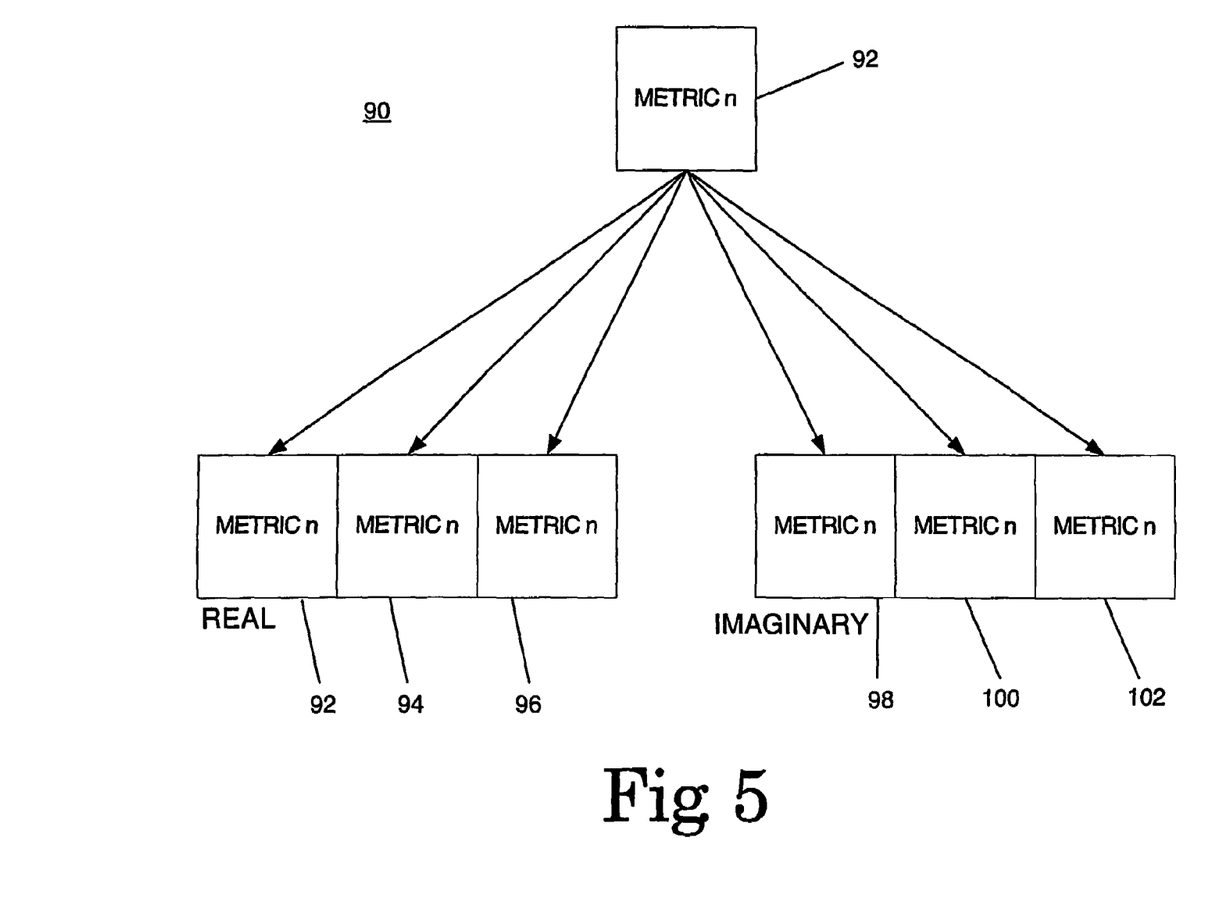
FIG. 5 is a diagram illustrating the assignment of weighting to the bits of an OFDM symbol.

The next step in determining the overall CQM of the channel illustrated in FIG. 4 is to map the previously-computed weights for each of the subcarriers 74-88 onto one metric for each bit in a received COFDM symbol. FIG. 5 illustrates the mapping of the metrics onto the received symbol bits for a 64-QAM constellation.

The diagram shown in FIG. 5 is generally referred to by the reference numeral 90. The metric previously assigned to the subcarrier is identified by the reference numeral 92. That metric is mapped to each bit in the COFDM symbol that is the resultant of the encoding constellation used to encode the bits prior to transmission. In a 64-QAM constellation, which is illustrated in FIG. 5, each symbol is mapped onto 6 bits. Three bits 92, 94, 96 represent a real part of the symbol. Three bits 98, 100, 102 represent an imaginary part of the signal. The weight of the metric n 92 may be replicated once for each bit in the symbol, as shown. Thus, if the metric "n" 92 was previously computed to be four (4), the value four (4) would be replicated six (6) times, once for each of the bits 92, 94, 96, 98, 100, 102 of the symbol. While the mapping of bits to a 64-QAM OFDM symbol is illustrated in FIG. 5, any encoding constellation may be employed in practicing the present invention. The specific encoding constellation is not a crucial aspect of the invention.

The next step in computing the CQM is to de-interleave the metrics previously assigned to each of the bits in the symbol during the previous step. De-interleaving is only required if the bits were interleaved as previously described prior to transmission. De-interleaving of previously interleaved bits when computing the CQM ensures accurate reflection of the effect that the given transmission channel will have on the actual data bits after interleaving because a contiguous set of errors prior to interleaving will be spread out after interleaving. In other words, de-interleaving ensures that the data used in computing the CQM is based on actual channel characteristics rather than a mathematically distributed sample that does not accurately reflect the characteristics of the transmission channel.

Figure 6:
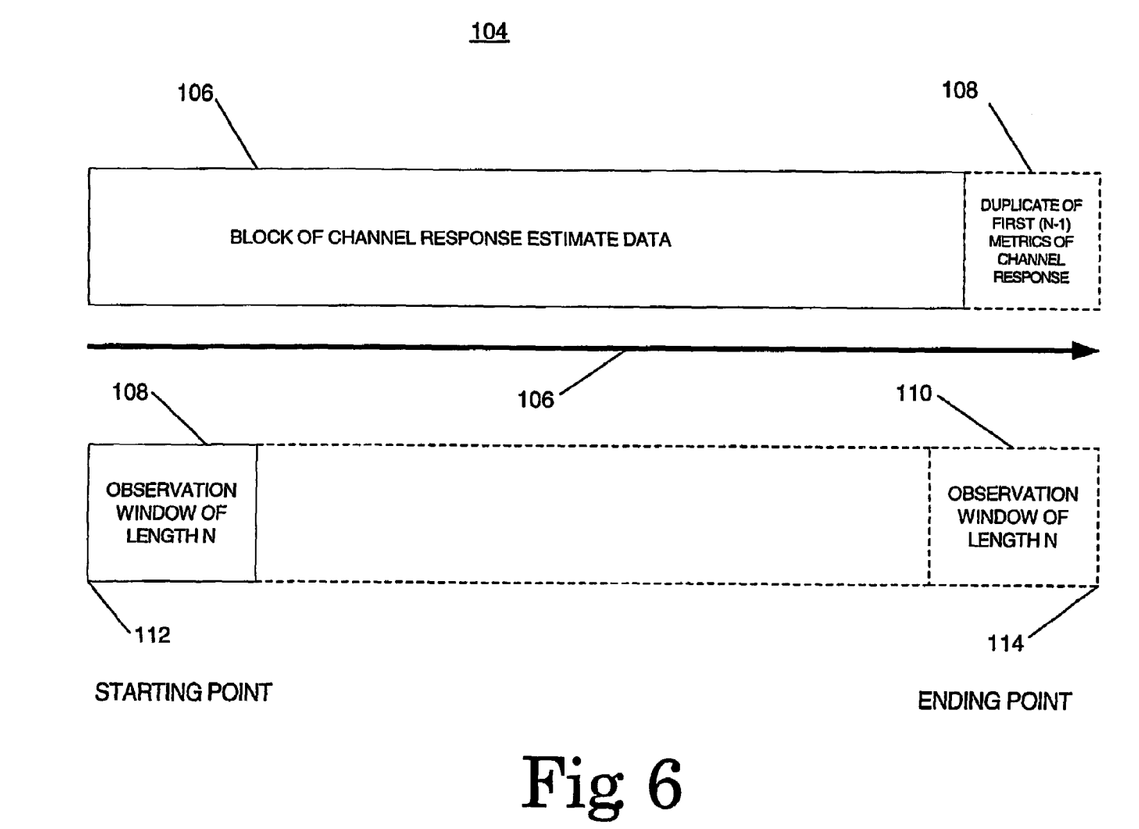
FIG. 6 is a diagram illustrating the iterative evaluation of channel response data according to the present invention.

The next step in computing the CQM for a given channel is to use a sliding window of length N to compute a CQM for each group of N bits in the channel response estimate based on the previously-assigned bit metrics. FIG. 6 is a diagram illustrating such a "sliding window" iterative evaluation of channel response data according to the present invention.

The diagram shown in FIG. 6 is generally referred to by the reference numeral 106. The overall CQM for a given antenna or channel is determined by selecting the lowest intermediate CQM corresponding to a string of bits of length N for the antenna or channel. A sliding window of length N is used to compute an intermediate CQM for each group of N bits in the channel response estimate based on the previously-assigned bit metrics. The lowest intermediate CQM for each antenna or channel evaluated corresponds to the longest successive bit stream of relatively suspect data that is likely to be interpreted incorrectly by the Viterbi decoder 48 (FIG. 2). After the lowest intermediate CQM for each antenna or channel is computed, that value is designated as the overall CQM for the antenna or channel. An OFDM receiver incorporating the present invention may be programmed to select the antenna or channel having the highest overall CQM for continued operation. In other words, the antenna or channel having the strongest worst-case transmission characteristics may be selected for continued operation. The antenna or channel having the strongest worst-case transmission characteristics is likely to have a low bit error rate (BER) compared to other available antennas or channels.

To perform the sliding window evaluation, a block of channel response estimate data formed as a result of the previous steps is stored in a memory device 106. In the illustrated embodiment, the relative strength values for each bit of each symbol for each subcarrier are stored sequentially in the memory 106. A block 108 of the first N-1 metrics of channel response data is duplicated at the end of the sequence of data stored in the memory 106. As will be seen, the purpose of the duplicate data block 108 is to allow a determination of whether the longest string of weak bits for a given antenna or channel is formed by a bit stream that starts towards the end of one symbol and wraps around to the beginning of the next symbol.

The evaluation begins at a starting point 112 and proceeds in the direction of an arrow 106 until concluding at an ending point 114. Each intermediate CQM for each group of bits of length N may be computed by summing the metrics for each bit in a length N window 108. After computing each intermediate CQM, the intermediate CQM value is stored in a memory location if it is the lowest intermediate CQM computed in the process so far. The sliding window is then moved over by one bit location to compute the next intermediate CQM. If the current intermediate CQM is smaller than the previous intermediate CQM, the current intermediate CQM value replaces the previous intermediate CQM value in the memory location. In this manner, a record of the lowest (i.e., worst) intermediate CQM value is found and stored.

As described above, the sliding window concludes with an evaluation of a block 110 corresponding to an intermediate CQM that represents the last bit in the channel response metric data and the first (N-1) bits in the channel response metric data as well. This is done to take into account the possibility that the worst-case intermediate CQM may occur in a bit stream that begins towards the end of one symbol and continues on through the beginning of the next symbol.

The value of N may be chosen to correspond to the correction power of the Viterbi decoder 48 (FIG. 2). More specifically, the value N may be chosen to be proportional to the length of the minimum distance path L in the Viterbi decoder's trellis for a given code. By choosing N in this manner, the sliding window evaluation process determines the intermediate CQMs based on longest string of "bad" bits that the Viterbi decoder 48 has the power to correct.

The motivation for this choice of a value for N is that the longest string of "bad" bits will be the determining factor of the quality of the antenna or channel. Because of the nature of convolutional coding, a string of low-reliability bits of length N is no worse than a string of M low-reliability bits where M>N. That is to say that the probability of the Viterbi decoder 48 making an incorrect decision will be lower for the channel for which the CQM is the highest (because high CQM metrics correspond to strong subcarriers).

As set forth above, the computation of the overall CQM for each antenna or channel being evaluated may be accomplished by performing the steps described above. The channel with the highest overall CQM may be selected for subsequent signal reception.

Figure 7:
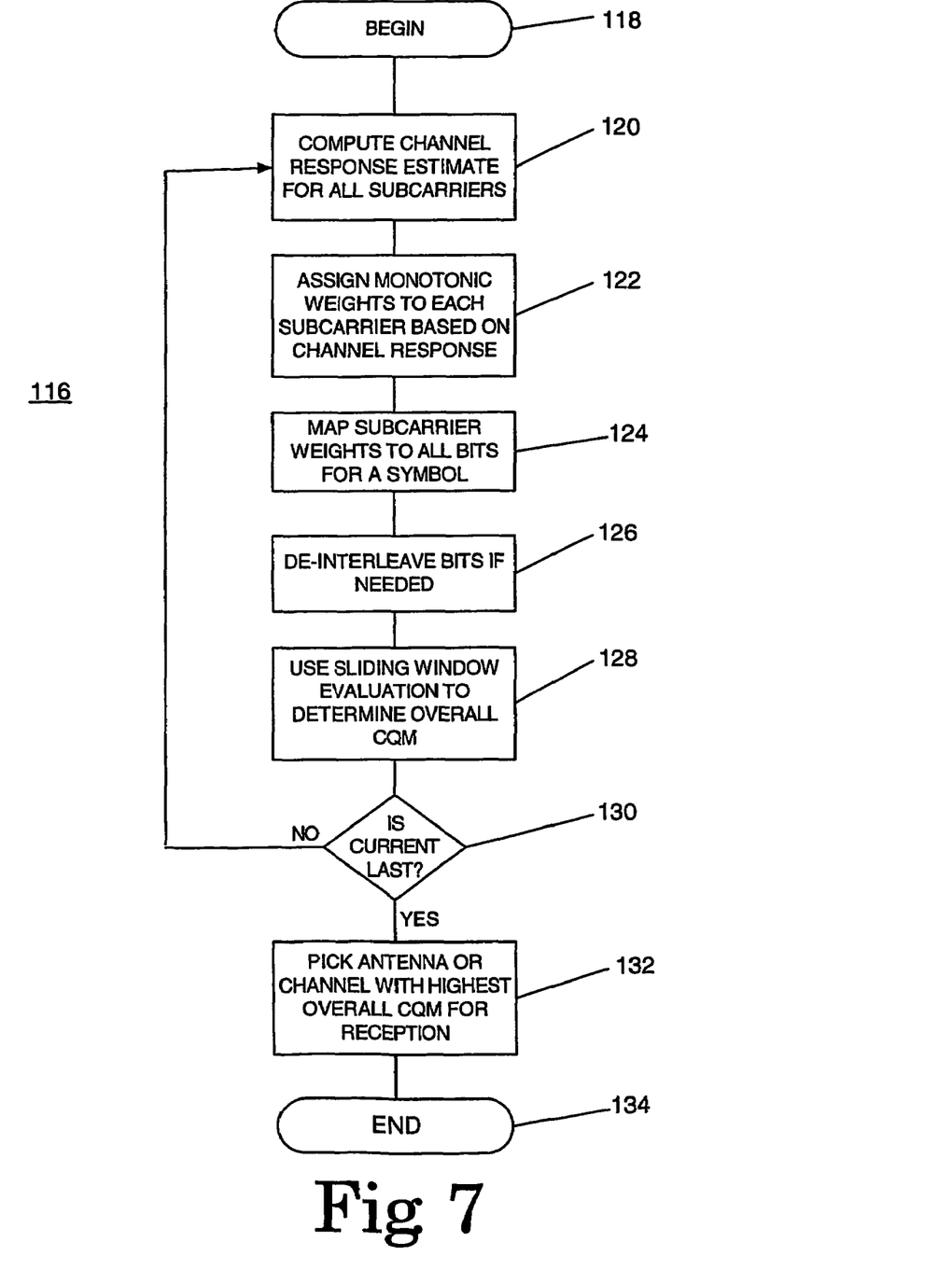
FIG. 7 is a process flow diagram illustrating the operation of an exemplary embodiment of the present invention.

FIG. 7 is a process flow diagram illustrating the operation of an exemplary embodiment of the present invention. The overall process is generally referred to by the reference numeral 116. Those of ordinary skill in the field will appreciate that the functions and operations illustrated in FIG. 7 may be accomplished using circuitry (hardware), software or combinations of hardware and software.

At 118, the process begins. Computation of channel response estimates for all subcarriers is performed at 120. Monotonic weights are assigned to each subcarrier based on its channel response at 122 and the weight to each subcarrier is mapped onto all bits corresponding to a symbol for the given constellation employed by the COFDM receiver at 124.

At 126 the bits are de-interleaved, if necessary. De-interleaving is needed if the bits were originally interleaved prior to transmission.

The sliding window evaluative technique described above with reference to FIG. 6 is performed at 128. The sliding window technique is used to compute successive intermediate CQMs for each bit window of length N. The overall CQM for a given antenna or channel is determined by selecting the lowest intermediate CQM for the antenna or channel being evaluated.

At decision 130, the determination of whether the current antenna or channel being evaluated is the last one is made. If not, the process of determining the overall CQM for the next antenna or channel continues at 120. If the current antenna or channel being evaluated is the last one, the most reliable antenna or channel is selected at 132. The most reliable antenna or channel is the one having the highest overall CQM. The process concludes at 134.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

The invention claimed is:

1. A method for selecting a channel from a plurality of channels to use for receiving a transmission, each channel having a plurality of subcarriers for receiving symbols, the symbols comprising a plurality of data bits, the method comprising the acts of:

for each of the plurality of channels, performing the acts of:
determining a channel response estimate for each of the plurality of subcarriers;
assigning a subcarrier metric to each subcarrier based on the channel response estimate for that subcarrier;
mapping the subcarrier metric to each of the plurality of data bits;
creating channel response data comprising the metrics assigned to each of the plurality of data bits for each subcarrier;
determining an intermediate channel quality metric (CQM) for each group of N bits of the channel response data by determining which group of N bits corresponds to the weakest corresponding channel response estimate, where N is an integer; and
selecting the intermediate channel quality metric corresponding to the weakest channel response estimate as the overall channel quality metric for the channel; and
selecting the channel having the highest overall channel quality metric for receiving the transmission.

2. The method of claim 1, comprising:
determining an intermediate channel quality metric for a group of N bits of channel response data where a portion of the N bits are selected from channel response data corresponding to a subcarrier at one end of a frequency range of the channel and a portion of the N bits are selected from channel response data corresponding to a subcarrier at the other end of the frequency range of the channel.

3. The method of claim 1, comprising:
de-interleaving the channel response data.

4. The method of claim 1 wherein the subcarrier metrics are monotonic and correspond to an associated subcarrier channel response estimate.

5. The method of claim 1 wherein the symbols are encoded using a 64-QAM constellation.

6. The method of claim 1 comprising:
decoding the symbols using a Viterbi algorithm.

7. The method of claim 6 wherein N is proportional to the correction power of the Viterbi algorithm.

8. A device that selects a channel from a plurality of channels to use for receiving a transmission, each channel having a plurality of subcarriers for receiving symbols, the symbols comprising a plurality of data bits, the device comprising:
circuitry adapted to determine a channel response estimate for each of the plurality of subcarriers;
circuitry adapted to assign a subcarrier metric to each subcarrier based on the channel response estimate for that subcarrier;
circuitry adapted to map the subcarrier metric to each of the plurality of data bits;
circuitry adapted to create channel response data comprising the metrics assigned to each of the plurality of data bits for each subcarrier;
circuitry adapted to determine an intermediate channel quality metric (CQM) for each group of N bits of the channel response data by determining which group of N bits corresponds to the weakest corresponding channel response estimate, where N is an integer; and
circuitry adapted to select the intermediate channel quality metric corresponding to the weakest channel response estimate as the overall channel quality metric for the channel; and
circuitry adapted to select the channel having the highest overall channel quality metric for receiving the transmission.

9. The device of claim 8, comprising:
circuitry adapted to determine an intermediate channel quality metric for a group of N bits of channel response data where a portion of the N bits are selected from channel response data corresponding to a subcarrier at one end of a frequency range of the channel and a portion of the N bits are selected from channel response data corresponding to a subcarrier at the other end of the frequency range of the channel.

10. The device of claim 8 wherein the subcarrier metrics are monotonic and correspond to an associated subcarrier channel response estimate.

11. The device of claim 8 wherein the symbols are encoded using a 64-QAM constellation.

12. The device of claim 8 comprising:
circuitry adapted to decode the symbols using a Viterbi algorithm.

13. The device of claim 12 wherein N is proportional to the correction power of the Viterbi algorithm.

14. An Orthogonal Frequency Division Multiplexing (OFDM) receiver that selects a channel from a plurality of channels to use for receiving a convolutionally encoded OFDM transmission, each channel having a plurality of subcarriers for receiving symbols, the symbols comprising a plurality of data bits, the OFDM receiver comprising:
circuitry adapted to determine a channel response estimate for each of the plurality of subcarriers;
circuitry adapted to assign a subcarrier metric to each subcarrier based on the channel response estimate for that subcarrier;
circuitry adapted to map the subcarrier metric to each of the plurality of data bits;
circuitry adapted to create channel response data comprising the metrics assigned to each of the plurality of data bits for each subcarrier;
circuitry adapted to determine an intermediate channel quality metric (CQM) for each group of N bits of the channel response data by determining which group of N bits corresponds to the weakest corresponding channel response estimate, where N is an integer; and
circuitry adapted to select the intermediate channel quality metric corresponding to the weakest channel response estimate as the overall channel quality metric for the channel; and
circuitry adapted to select the channel having the highest overall channel quality metric for receiving the transmission.

15. The Orthogonal Frequency Division Multiplexing (OFDM) receiver of claim 14, comprising:
circuitry adapted to determine an intermediate channel quality metric for a group of N bits of channel response data where a portion of the N bits are selected from channel response data corresponding to a subcarrier at one end of a frequency range of the channel and a portion of the N bits are selected from channel response data corresponding to a subcarrier at the other end of the frequency range of the channel.

16. The Orthogonal Frequency Division Multiplexing (OFDM) receiver of claim 14, comprising:
circuitry adapted to de-interleave the channel response data.

17. The Orthogonal Frequency Division Multiplexing (OFDM) receiver of claim 14 wherein the subcarrier metrics are monotonic and correspond to an associated subcarrier channel response estimate.

18. The Orthogonal Frequency Division Multiplexing (OFDM) receiver of claim 14 wherein the symbols are encoded using a 64-QAM constellation.

19. The Orthogonal Frequency Division Multiplexing (OFDM) receiver of claim 14 comprising:
circuitry adapted to decode the symbols using a Viterbi algorithm.

20. The Orthogonal Frequency Division Multiplexing (OFDM) receiver of claim 19 wherein N is proportional to the correction power of the Viterbi algorithm.

* * * * *